(12) United States Patent
Kurtzman et al.

(10) Patent No.: US 7,355,456 B2
(45) Date of Patent: Apr. 8, 2008

(54) WIDE LINEAR RANGE PEAK DETECTOR

(75) Inventors: Gary A. Kurtzman, Austin, TX (US); Steven P. Hoggarth, Sunrise, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 54 days.

(21) Appl. No.: 11/199,493

(22) Filed: Aug. 8, 2005

(65) Prior Publication Data

US 2007/0030034 A1    Feb. 8, 2007

(51) Int. Cl.
*G01R 19/00* (2006.01)
(52) U.S. Cl. .......................... 327/58; 327/96
(58) Field of Classification Search ................. 327/50, 327/58–63, 65–70, 72, 73, 91, 93–96
See application file for complete search history.

(56) References Cited

U.S. PATENT DOCUMENTS

| | | | | |
|---|---|---|---|---|
| 4,091,329 | A | * | 5/1978 | Fletcher et al. ............ 327/350 |
| 4,994,692 | A | * | 2/1991 | Wolke ........................ 327/50 |
| 6,064,238 | A | * | 5/2000 | Wight et al. ................ 327/58 |
| 6,211,716 | B1 | * | 4/2001 | Nguyen et al. ............. 327/307 |
| 6,531,860 | B1 | * | 3/2003 | Zhou et al. ................. 324/105 |
| 6,735,260 | B1 | * | 5/2004 | Eliezer et al. .............. 375/316 |
| 6,778,013 | B1 | * | 8/2004 | Ali ............................. 330/252 |
| 7,119,584 | B1 | * | 10/2006 | Ali ............................. 327/91 |
| 7,135,892 | B2 | * | 11/2006 | Doyle et al. ................ 327/58 |

OTHER PUBLICATIONS

Robert G. Meyer, *Low-Power Monolithic FR Peak Detector Analysis*, IEEE Journal of Solid-State Circuits, vol. 30, No. 1, Jan. 1995, pp. 65-67.

* cited by examiner

*Primary Examiner*—Kenneth B. Wells
*Assistant Examiner*—William Hernandez
(74) *Attorney, Agent, or Firm*—Gary R Stanford (57) ABSTRACT

A wide linear range peak detector including first and second peak detectors and a compensation circuit. The first peak detector receives an input signal and has an output providing a first peak signal approximation which approximates a peak level of the input signal. The first peak signal approximation includes a non-linear portion which is a function of the peak level of the input signal. The second peak detector also receives the input signal and has an output providing a second peak signal approximation. The compensation circuit uses the second peak signal approximation to provide a compensation signal which compensates the non-linear portion of the first peak signal approximation. In particular, the second peak signal is used to generate the compensation signal to approximate and cancel the non-linear portion.

18 Claims, 6 Drawing Sheets

WIDE LINEAR RANGE PEAK DETECTOR

BACKGROUND OF THE INVENTION

1. Field of the invention

The present invention relates in general to peak detectors, and more specifically to a wide linear range peak detector with increased input range as compared to standard peak detector designs.

2. Description of the related art

Signal level detectors including peak detectors are used in communication systems that use feedback to monitor a signal for purposes of control, such as for controlling an automatic gain control (AGC) circuit or the like. Open-loop systems are known, but are relatively complex and not suitable for many applications. The transfer function of most conventional open-loop configurations is not linear over the entire operating voltage range of the output signal. In order to achieve the desired accuracy, the non-linear portions of the transfer function must be mapped and stored. The greater the non-linearity, the more circuitry or memory required to ensure proper and accurate operation. And such mapping is conducted at the time of manufacture, thereby complicating and slowing down the manufacturing process. Feedback systems are generally more cost effective since open-loop systems require significantly more memory and mapping. The efficiency and effectiveness of a feedback system, however, necessitates the use of a detector that is consistently linear over the necessary range of operation. The present invention is illustrated with detectors for the radio-frequency (RF) signal range, although it is understood that the present invention equally applies to other frequency ranges.

It is desired to extend the linear operating range of a peak detector to improve accuracy and reliability and to simplify a feedback peak detector circuit and the manufacturing process.

BRIEF DESCRIPTION OF THE DRAWINGS

The benefits, features, and advantages of the present invention will become better understood with regard to the following description, and accompanying drawing in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
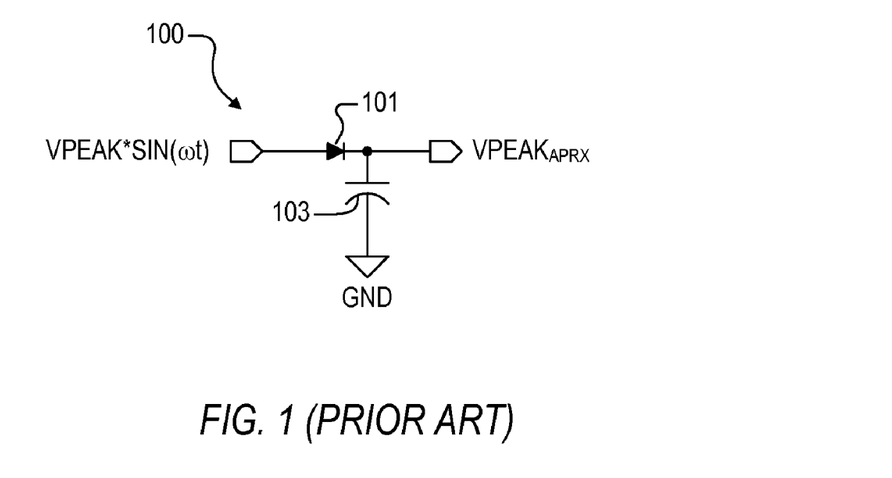
FIG. 1 is a schematic diagram of a relatively simple and conventional diode-based single-ended peak detector (PD) for RF applications.

FIG. 1 is a schematic diagram of a relatively simple and conventional diode-based single-ended peak detector (PD) 100 for RF applications. An input signal VPEAK*SIN($\omega$t) is provided to the anode of a rectifier or diode 101, having its cathode coupled to one end of a capacitor 103. As used herein an asterisk "*" denotes multiplication, SIN is the sinusoidal function, $\omega$ is the frequency in radians ($\omega$=2$\pi$f where "$\pi$" is the mathematic constant pi and "f" is frequency in Hertz) and "t" is time. The other end of the capacitor 103 is coupled to ground (GND) and the cathode of the diode 101 develops an output signal $VPEAK_{APRX}$, which is an approximation of the peak magnitude of the input signal, or VPEAK. The diode-based PD 100 is very simple and easy to implement but has several disadvantages. The diode-based PD 100 has a relatively low input impedance so that the input signal must have sufficient power to drive a relatively high level of input current. Also, the diode-based PD 100 is not linear over the entire operating voltage range, so that it has a relatively limited linear range. Also, the output signal $VPEAK_{APRX}$ is not stable and changes with process, voltage and temperature (PVT) variations.

Figure 2:
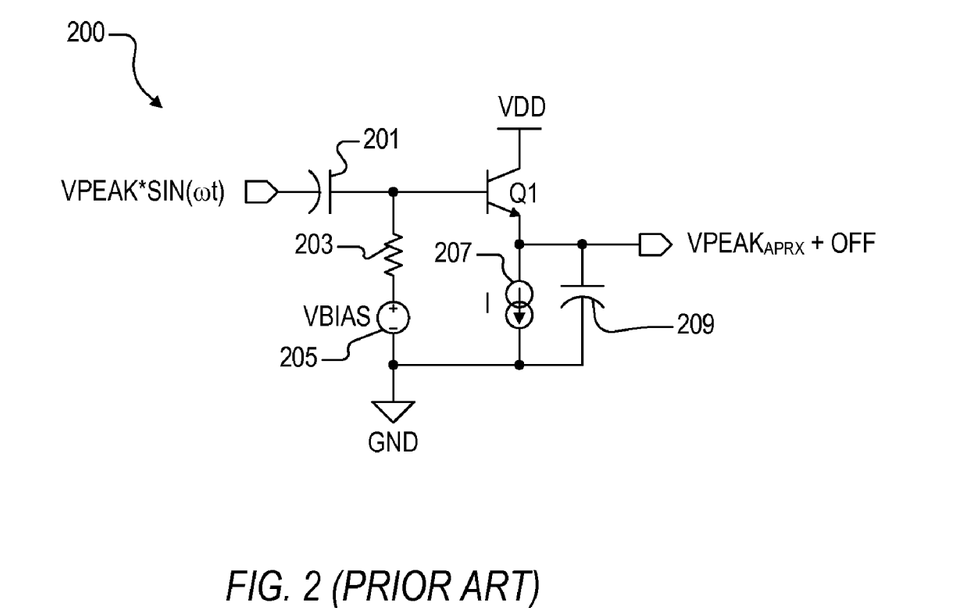
FIG. 2 is a schematic diagram of a conventional transistor-based single-ended PD for RF applications.

FIG. 2 is a schematic diagram of a conventional transistor-based single-ended PD 200 for RF applications. The input signal VPEAK*SIN($\omega$t) is provided to one end of an input coupling capacitor 201, having its other end coupled to one end of a bias resistor 203 and to the base electrode (or "base") of an NPN bipolar-junction transistor Q1. The other end of the resistor 203 is coupled to the positive terminal of a voltage source 205, which has a negative terminal coupled to GND. The transistor Q1 has a collector electrode (or "collector") coupled to a voltage source VDD and an emitter electrode (or "emitter") coupled to an input of a constant current sink 207 and to one end of an output filter capacitor 209. The output of the current sink 207 and the other end of the capacitor 209 are coupled to GND. The current sink 207 draws a constant current I from the emitter of the transistor Q1. The voltage source 205 generates a bias voltage VBIAS used to set the operating point of Q1. The emitter of the transistor Q1 develops a single-ended output signal $VPEAK_{APRX}$+OFF, in which $VPEAK_{APRX}$ is an approximation of the magnitude VPEAK of the input signal and OFF is a DC offset.

The transistor-based PD 200 provides superior results as compared to the diode-based PD 100. The gain of the transistor Q1 enables a lower power input signal so that it does not have to drive a significant level of input current. The transistor-based PD 200, however, generates a DC offset on the output signal. The output voltage $VPEAK_{APRX}$+OFF is relatively linear for most of the input voltage range, as further described below, but exhibits a non-linear characteristic at lower voltage signal levels. The non-linear characteristic limits the linear range of operation. The PD 200 is also subject to PVT variations, which cause corresponding variations in $\text{VPEAK}_{APRX}$ and the DC offset voltage OFF. This results in less accuracy for $\text{VPEAK}_{APRX}$ and a DC offset voltage which varies considerably from chip to chip. The DC offset voltage OFF must be determined and mapped accordingly at the time of manufacture to ensure proper operation when used in a circuit.

Figure 3:
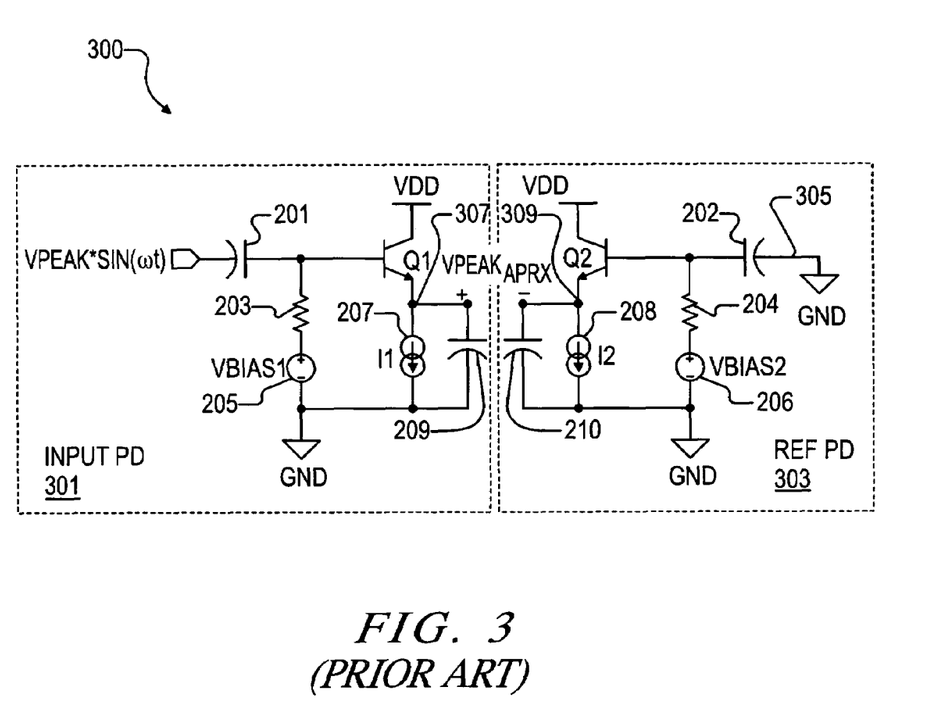
FIG. 3 is a schematic diagram of a conventional differential transistor-based PD for RF applications.

FIG. 3 is a schematic diagram of a conventional differential transistor-based PD 300 for RF applications. The differential PD 300 includes a pair of single-ended transistor-based PDs 301 and 303 which are each substantially identical to the single-ended transistor-based PD 200 previously described, in which similar components assume identical reference numbers. As shown, the PD 301 has the same components as the PD 200 and forms an input PD receiving the input signal $\text{VPEAK}*\text{SIN}(\omega t)$ at its input. The voltage supply 205 is shown providing a voltage VBIAS 1 and the current sink 207 is shown sinking a current I1. The PD 303 includes capacitor 202, resistor 204, voltage source 206, transistor Q2, current sink 208 and output capacitor 210, which are coupled and configured in the same manner as the corresponding components 201, 203, 205, Q1, 207 and 209 of the PD 200. The voltage source 206 develops a bias voltage VBIAS2 and the current sink 208 draws a constant current I2 from the emitter of Q2. The PD 303 forms a reference PD which has an input node 305 coupled to a suitable constant DC voltage level (e.g., GND) rather than the input signal. The PDs 301 and 303 include a pair of capacitor-coupled output nodes 307 and 309, respectively, which collectively develop a differential output signal $\text{VPEAK}_{APRX}$ in which node 307 is a positive polarity (+) and node 309 is the negative polarity (−). The node 309 generally develops the DC offset voltage OFF, so that the DC offset is effectively removed resulting in the differential signal $\text{VPEAK}_{APRX}$.

In one embodiment, the corresponding components and values are made identical with each other for symmetry and to minimize PVT variations and DC offset. Thus, the resistors 203 and 204 are equal, the capacitors 201 and 202 are equal, the capacitors 209 and 210 are equal, and the transistors Q1 and Q2 are made with identical characteristics. The voltage sources 205 and 206 are made the same so that the bias voltages are the same, or VBIAS1=VBIAS2. The current sources 207 and 208 are made identical with each other so that I1=I2.

The differential PD 300 provides several advantages over the single-ended PD 200. The PD 303 develops a DC offset voltage OFF at its output node 309 substantially equal to the DC offset of $\text{VPEAK}_{APRX}$, so that the differential output is a better representation of the VPEAK. PVT variations are common to both of the PDs 301 and 303 so that such variations tend to cancel rending a more accurate representation of VPEAK and minimizing the DC offset voltage variations. Thus, the differential PD 300 is particularly suited for integration onto a chip or integrated circuit (IC). Yet in the same manner as the single-ended PD 200, the differential signal $\text{VPEAK}_{APRX}$ exhibits a non-linear characteristic at lower voltage signal levels. The transfer function of the differential PD 300 is according to the following equation 1:

$$\text{VPEAK}_{APRX} = \text{VPEAK} - VT^* \ln[(I1/I2)^* SQRT [2\pi^* \text{VPEAK}/VT]] \quad (1)$$

where VT is the threshold voltage (equal to Boltzmann's constant divided by electron charge or VT=kT/q as known to those skilled in the art), and "ln" is the natural logarithm function. The logarithmic term in the equation, or $VT^* \ln[(I1/I2)^* SQRT[2\pi^* \text{VPEAK}/NVT]]$, represents the non-linearity which is more significant when VPEAK is small but which becomes negligible as VPEAK gets larger. The differential PD 300 would be "perfectly" linear if not for the non-linear term.

Figure 4:
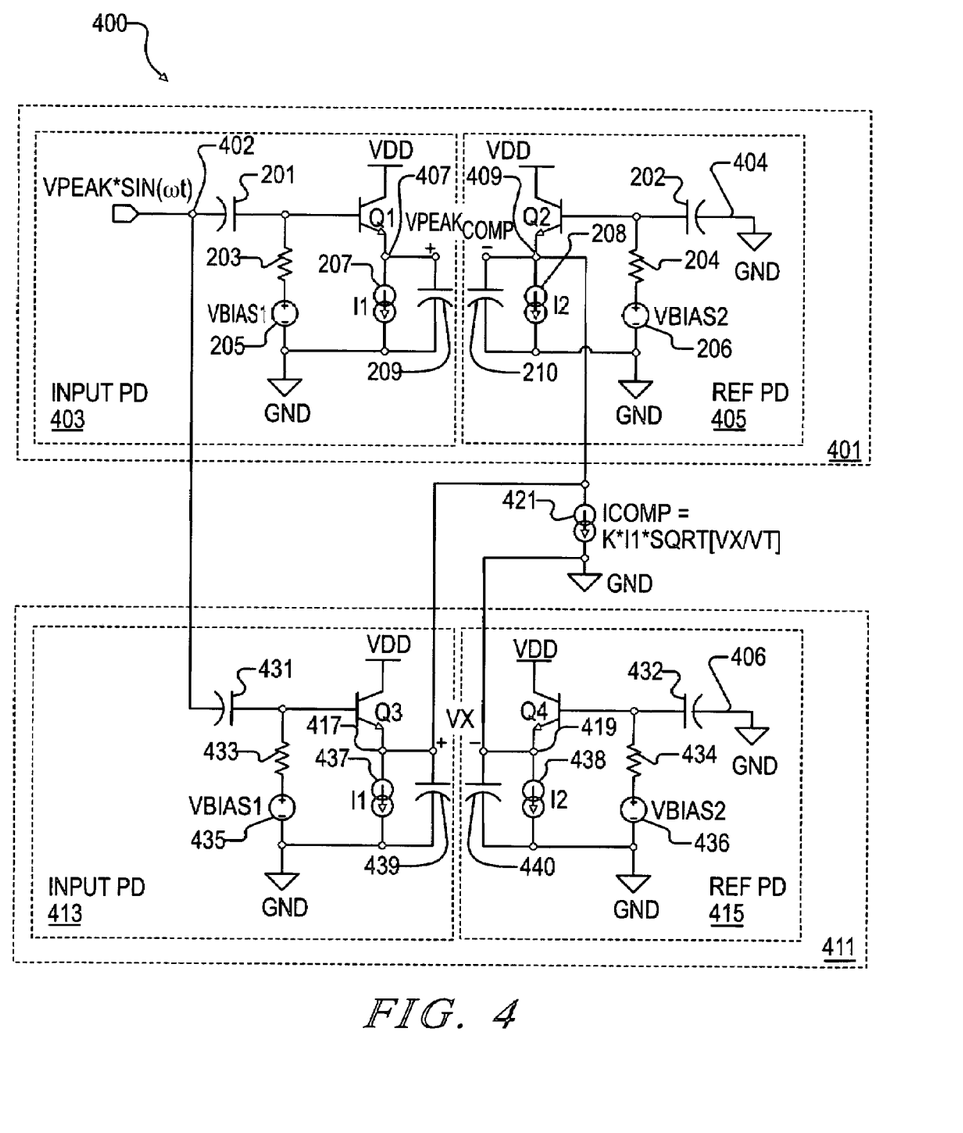
FIG. 4 is a schematic diagram of a wide linear range (WLR) differential PD implemented according to an exemplary embodiment of the present invention.

FIG. 4 is a schematic diagram of a wide linear range (WLR) differential PD 400 implemented according to an exemplary embodiment of the present invention. The WLR differential PD 400 includes a first differential PD 401 and a second differential PD 411, each configured substantially identical to the differential PD 300. The differential PD 401 includes an input PD 403 and a reference PD 405 which are configured substantially the same as the input PD 301 and the reference PD 303, respectively, of the differential PD 300, in which similar components assume identical reference numbers. The input PD 403 has an input node 402 coupled to receive the input signal $\text{VPEAK}*\text{SIN}(\omega t)$ and an output node 407 providing the positive polarity (+) of a compensated differential output signal $\text{VPEAK}_{COMP}$. The reference PD 405 of the first differential PD 401 has an input node 404 coupled to a constant DC voltage level, such as GND, and an output node 409 providing the negative polarity (−) of the compensated differential output signal $\text{VPEAK}_{COMP}$.

The input PD 413 includes a capacitor 431, a resistor 433, a voltage source 435, a current sink 437, a capacitor 439 and a bipolar-junction transistor Q3 configured in substantially the same manner as the capacitor 201, the resistor 203, the voltage source 205, the current sink 207, the capacitor 209 and the bipolar-junction transistor Q1 of the input PD 403, where the voltage source 435 develops the voltage VBIAS1 and the current sink 437 sinks the current I1. The input PD 413 has its input coupled to input node 402 to receive the input signal $\text{VPEAK}*\text{SIN}(\omega t)$ and an output node 417 developing the positive polarity (+) of another differential signal VX. The reference PD 415 includes a capacitor 432, a resistor 434, a voltage source 436, a current sink 438, a capacitor 440 and a bipolar-junction transistor Q4 configured in substantially the same manner as the capacitor 202, the resistor 204, the voltage source 206, the current sink 208, the capacitor 210 and the bipolar-junction transistor Q2 of the reference PD 405, where the voltage source 436 develops the voltage VBIAS2 and the current sink 438 sinks the current I2. The reference PD 415 includes an input node 406 coupled to a constant DC voltage level, such as ground, and an output node 419 providing the negative polarity (−) of the differential signal VX.

The differential output signal VX of the differential PD 411 is provided to a compensation current sink 421, which develops a compensation current signal according to the following equation 2:

$$ICOMP = K^* I1^* SQRT[VX/VT] \quad (2)$$

where K is a constant. The input of the compensation current sink 421 is coupled to the output node 409 of the reference PD 405 and the output of the compensation current sink 421 is coupled to GND. Since the differential PD 411 is configured the same as the differential PD 300 and receives the same input, VX is generally the same as $\text{VPEAKA}_{APRX}$. Rather than use this as the final output, however, the differential signal VX is used as an input to the compensation current sink 421 to develop the compensation current signal ICOMP, which adjusts the output node 409 to compensate for non-linearity of the $VPEAK_{APRX}$. Since the node 409 is capacitor-coupled, the compensation signal is conveniently in the form of a current which offsets the current provided by the transistor Q2. This added compensation at least partially compensates for the non-linearity of the $VPEAK_{APRX}$ signal, so that the differential signal $VPEAK_{COMP}$ is a more linear and thus more accurate representation of VPEAK.

The logarithmic term $VT*\ln[(I1/I2)*SQRT[2\pi*VPEAK/VT]]$ becomes zero if the current I2 is according to the following equation 3:

$$I2=I1*SQRT[2\pi*VPEAK/VT] \quad (3)$$

since this would make the operand of the logarithmic function $(I1/I2)*SQRT[2\pi*VPEAK/VT]$ equal to one (1) and $\ln[1]=0$. The format of the ICOMP function follows the format of the non-linear logarithmic term in the term in the transfer function equation of the differential PD if I1=I2 and the constant K is set equal to $SQRT[2\pi]$ or about 2.5. The second, essentially duplicate differential PD 411 provides VX as a representation of VPEAK. Thus, VX is used as VPEAK and the compensation current sink 421 develops the compensation current ICOMP according to equation 3 to compensate for the non-linearity of the output of the differential PD 401.

Figure 5:
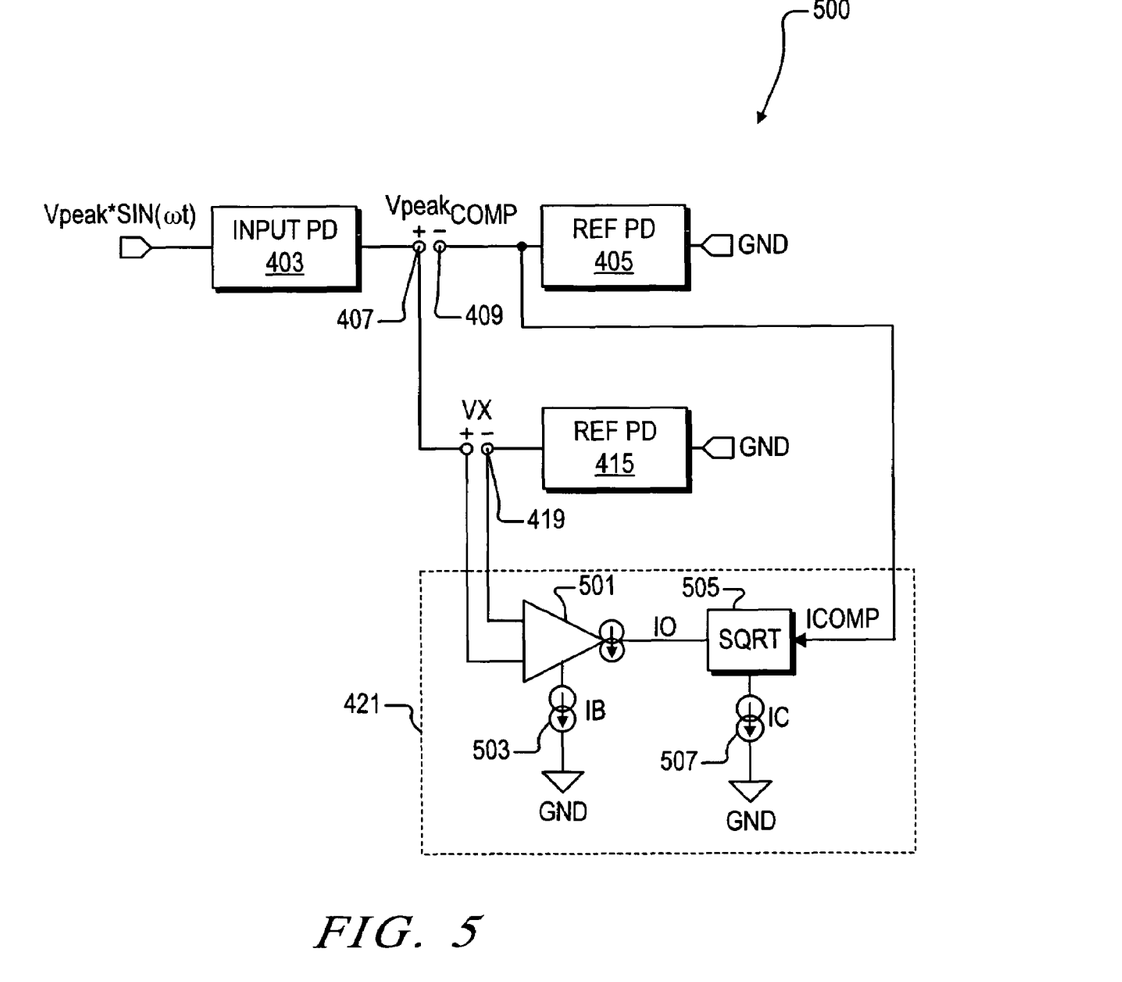
FIG. 5 is a simplified block diagram of another WLR differential PD implemented according to another exemplary embodiment of the present invention and illustrating further details of an exemplary embodiment of the compensation current sink of FIG. 4.

FIG. 5 is a simplified block diagram of another WLR differential PD 500 implemented according to another exemplary embodiment of the present invention and illustrating further details of an exemplary embodiment of the compensation current sink 421. The input PD 413 of the WLR differential PD 400 is a duplicate of the input PD 403, so that one input PD is eliminated. The input signal is provided to the input PD 403 having its output node 407 providing the positive polarity for the compensated differential output signal $VPEAK_{COMP}$. The reference PD 405 has its input coupled to GND and its output node 409 providing the negative polarity of the compensated differential output signal $VPEAK_{COMP}$. Node 407 also serves as the positive polarity of the differential signal VX relative to the output node 419 of the reference PD 415 (having its input coupled to GND), where the node 419 provides the negative polarity of the VX signal. The positive and negative polarities of the VX signal are provided to respective inputs of a tranconductance amplifier 501 biased with a current sink 503 developing a constant current IB, where the tranconductance amplifier 501 converts VX into a current IO. As described further below, the current IO is adjusted to equal to VX*IB/VT. The IO current is provided to a square-root functional circuit 505 biased with a constant current sink 507 developing a constant current IC, where the square-root functional circuit 505 converts IO into the compensation current ICOMP at its output. The output of the square-root functional circuit 505 is coupled to the node 409 to provide the desired compensation for the compensated output signal $VPEAK_{COMP}$.

The square-root functional circuit 505 has a transfer function according to the following equation 4:

$$ICOMP=SQRT[IO*IC]=SQRT[VX*IB*IC/VT] \quad (4)$$

If IB=IC, then the compensation current ICOMP is restated according to the following equation 5:

$$ICOMP=IB*SQRT[VX/VT] \quad (5)$$

The non-linearity is reduced if ICOMP is according to the following equation 6:

$$ICOMP=I1*SQRT[2\pi*VPEAK/VT]=K*I1*SQRT[VPEAK/VT] \quad (6)$$

for $K=SQRT[2\pi]\approx2.5$. This is approximated by substituting VX for VPEAK and setting IB=K*I1. In one embodiment, IB and IC are made equal so that IB=IC=K*I1. Alternatively, IB and IC can both be made equal to I1, or IB=IC=I1, and the K factor is achieved by a separate functional multiplier circuit (not shown). As known to those skilled in the art, a current mirror configuration or the like (not shown) may be used to multiply a current by any suitable factor, including the constant $SQRT[2\pi]$.

Figure 6:
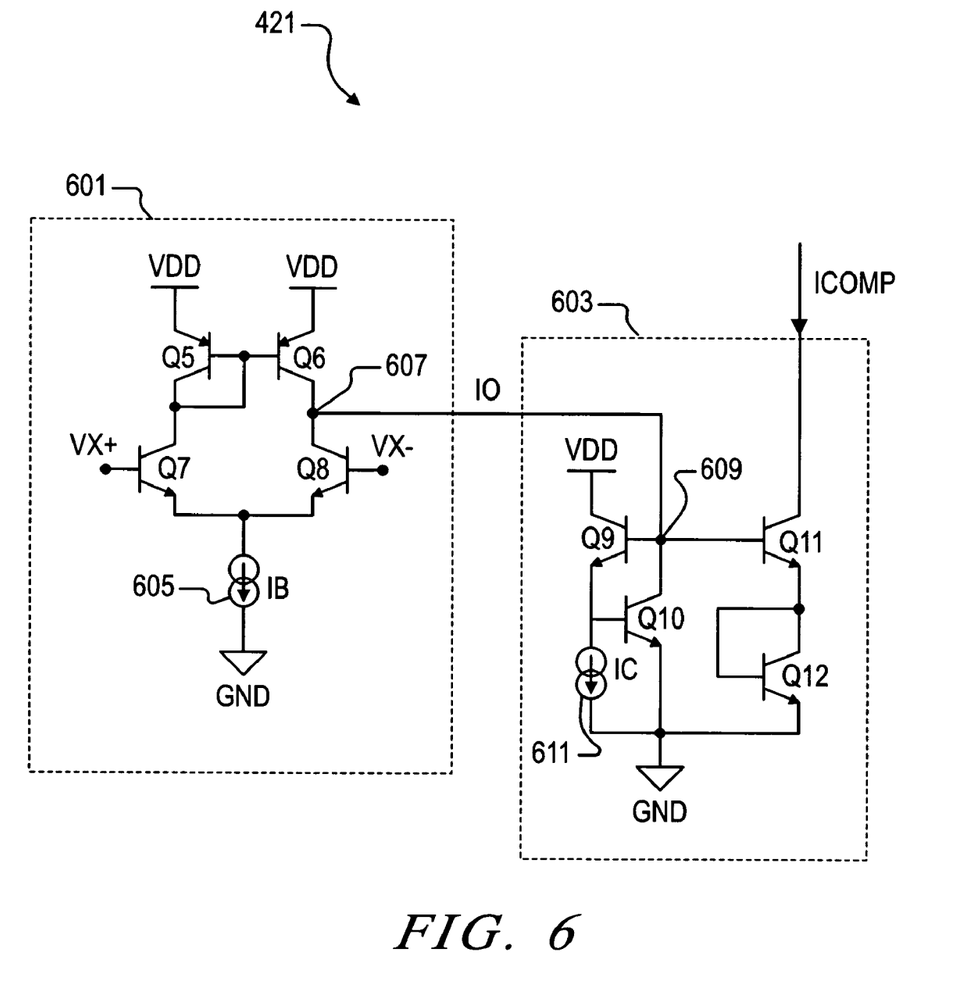
FIG. 6 is a schematic diagram illustrating a more specific configuration of the compensation current sink of FIG. 4 according to an exemplary embodiment of the present invention.

FIG. 6 is a schematic diagram illustrating a more specific configuration of the compensation current sink 421 according to an exemplary embodiment of the present invention. In this case, the compensation current sink 421 includes a bipolar differential pair circuit 601 and a translinear loop square root circuit 603. VDD is coupled to the emitters of each of a pair of PNP bipolar junction transistors Q5 and Q6 of the bipolar differential pair circuit 601. The bases of Q5 and Q6 are coupled together. The base and collector of Q5 is coupled to the collector of an NPN bipolar junction transistor Q7 and the collector of Q6 is coupled to a node 607, which is coupled to the collector of another NPN bipolar junction transistor Q8. The emitters of Q7 and Q8 are coupled together and to the input of a constant current sink 605, having its output coupled to GND. The current sink 605 develops the current IB. The positive (VX+) and negative (VX−) polarities of the VX signal are provided to the bases of Q7 and Q8, respectively, in which Q7 and Q8 form a differential pair. The node 607 develops the output current IO, which is provided to a node 609 of the translinear loop square root circuit 603. In the translinear loop square root circuit 603, VDD is coupled to the collector of an NPN bipolar junction transistor Q9, having its base coupled to node 609 and its emitter coupled to the base of another NPN bipolar junction transistor Q10. The output of the current sink 611 is coupled to GND and the current sink 611 develops the constant current IC. The collector of Q10 is coupled to node 609 and its emitter is coupled to GND. Node 609 is coupled to the base of another NPN bipolar-junction transistor Q1 having its emitter coupled to the base and collector of another NPN bipolar-junction transistor Q12. The emitter of Q12 is coupled to GND. The collector of Q11 develops the ICOMP compensation current.

In this case, the polarities of the differential signal VX are provided to the differential inputs of the bipolar differential pair circuit 601 performing the voltage to current transformation and developing the current signal IO. The differential pair circuit 601 has the transfer function IO=IB*(VX/VT) as desired. The bipolar differential pair circuit 601 provides correction over a limited range of 0 <VX/VT <4, which is the same range as the non-linearity of the conventional differential PD 300. The IO signal is provided to the input of the translinear loop square root circuit 603, which converts IO to ICOMP. The translinear loop square root circuit 603 has the desired transfer function of ICOMP=SQRT[IO*IC] as understood by those skilled in the art. In one embodiment, the current levels of IB and IC are selected as described above to incorporate the K factor to achieve the overall desired transfer function. Alternatively, either one of IB or IC can incorporate K. Or, IB and IC can both be set equal to I1, and an additional multiplying current mirror or the like (not shown) can be provided at the output of the translinear loop square circuit 603 to multiply its output by the desired K factor.

It is noted that in the ideal case, the current sink 208 of the conventional differential PD 300 developing the current I2 is replaced by the compensation current sink 421 developing the compensation current ICOMP. Such replacement results in a more linear transfer function. A disadvantage of eliminating the current sink 208, however, is that the DC offset OFF remains. As previously described, the DC offset OFF varies with PVT so that it is otherwise unpredictable and thus undesirable. In this manner, the compensation current sink 421 does not replace the current sink 208 but instead is simply added in the WLR differential PD 400 (and the WLR differential PD 500), so that the current sink 208 remains to minimize the DC offset. The current sink 208 does tend to overwhelm the output of the compensation current sink 421 at very small input signal values so that some non-linearity still remains; yet this is an acceptable trade-off since the non-linearity is still substantially reduced while the DC offset is minimized.

Figure 7:
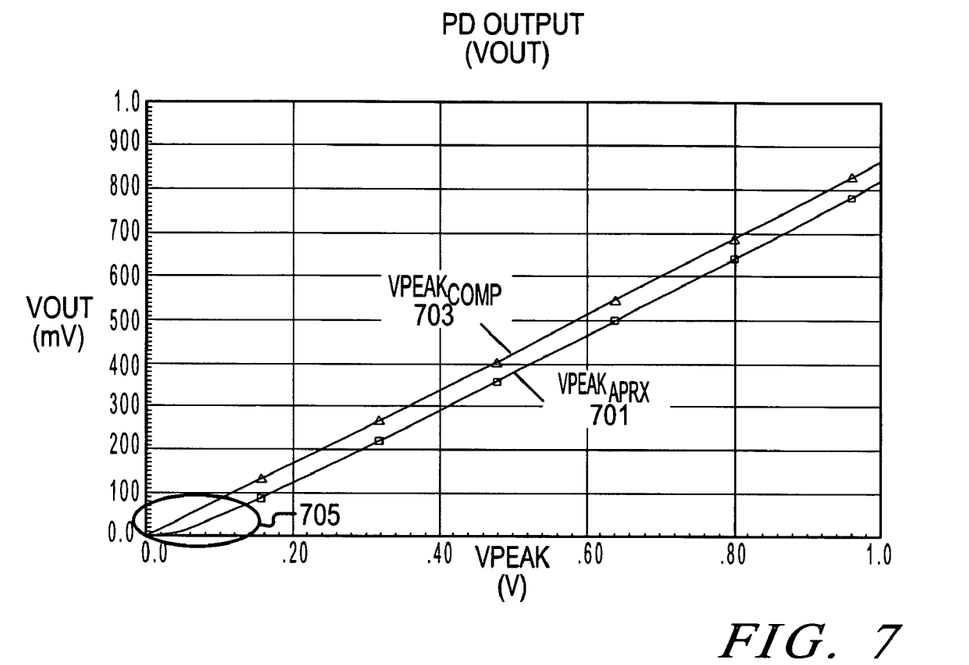
FIG. 7 is a graph diagram plotting the peak detector output (VOUT) for both the conventional differential PD of prior art and the WLR differential PD of FIG. 4 implemented according to the present invention versus VPEAK.

FIG. 7 is a graph diagram plotting the peak detector output (VOUT) for both the conventional differential PD 300 of prior art and the WLR differential PD 400 implemented according to the present invention versus VPEAK. VOUT is shown in millivolts (mV) and VPEAK is shown Volts (V). VOUT is shown as a curve 701 for $VPEAK_{APRX}$ for the differential PD 300 and is shown as a curve 703 for $VPEAK_{COMP}$ for the WLR differential PD 400. As shown within balloon 705, $VPEAK_{APRX}$ generated by the conventional differential PD 300 is non-linear for at least the first 200 mV of VPEAK, whereas $VPEAK_{COMP}$ generated by the WLR differential PD 400 is substantially linear almost all the way down to about 40 mV of VPEAK.

Figure 8:
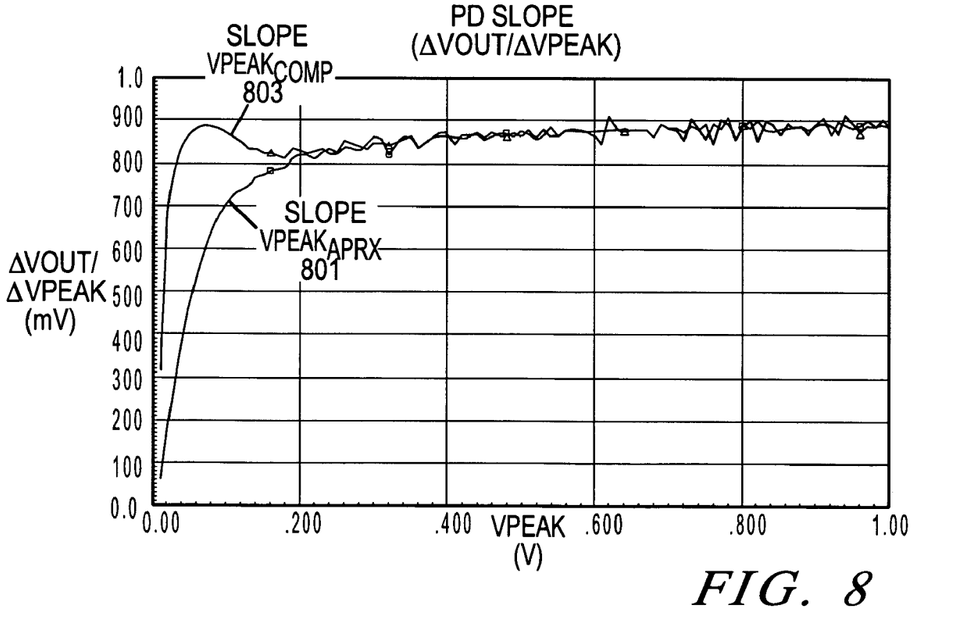
FIG. 8 is a graph diagram plotting the peak detector slope ($\Delta$VOUT/$\Delta$VPEAK) for both the conventional differential PD of prior art and the WLR differential PD of FIG. 4 implemented according to the present invention versus VPEAK.

FIG. 8 is a graph diagram plotting the peak detector slope ($\Delta VOUT/\Delta VPEAK$) for both the conventional differential PD 300 of prior art and the WLR differential PD 400 implemented according to the present invention versus VPEAK. The PD SLOPE is shown in mV and VPEAK is shown Volts. The notation $\Delta VOUT/\Delta VPEAK$ refers to the change of VOUT versus the change of VPEAK as understood by those skilled in the art. The slope is shown as a curve 801 for $VPEAK_{APRX}$ for the differential PD 300 and is shown as a curve 803 for $VPEAK_{COMP}$ for the WLR differential PD 400. If the slope is to be kept within +/−10% of the nominal value, the conventional differential PD 300 only meets the goal for VPEAK greater than 180 mV, whereas the WLR differential PD 400 meets the goal all the way down to about 30 mV. In this case, the WLR differential PD 400 provides at least a 15 decibel (dB) improvement in input range.

A wide linear range peak detector according to an embodiment of the present invention includes first and second peak detectors and a compensation circuit. The first peak detector has an input receiving an input signal and an output providing a first peak signal approximation which approximates a peak level of the input signal. The first peak signal approximation includes a non-linear portion which is a function of the peak level of the input signal. The second peak detector has an input receiving the input signal and an output providing a second peak signal approximation. The compensation circuit has an input receiving the second peak signal approximation and an output which is coupled to the first peak detector. The compensation circuit uses the second peak signal approximation to provide a compensation signal which compensates the non-linear portion of the first peak signal approximation.

The non-linear portion tends to limit the range of conventional peak detectors, where the non-linear term is mathematically based on the peak signal. A second peak signal approximation is generated and used by the compensation circuit to generate the compensation signal, which is configured to follow or approximate the non-linear portion. This compensation signal is then applied to the first peak signal approximation to cancel a significant amount of the non-linear term, which increases the range of the peak detector.

In one embodiment, the first peak detector is a differential peak detector which provides the first peak signal approximation with positive and negative polarity signals. The compensation circuit has an output which is coupled to one of the negative polarity signals of the first peak signal approximation. In a more specific embodiment, each of the first and second peak detectors includes a pair of single-ended peak detectors, including an input peak detector and a reference peak detector. The input single-ended peak detector receives the input signal and generates the positive polarity of a respective one of the first and second peak signal approximations. The reference single-ended peak detector has its input coupled to a constant level (e.g., a constant DC voltage or ground), and generates a negative polarity of a respective one of the first and second peak signal approximations. In more specific configurations, the negative polarity signal develops a DC offset to cancel the DC offset for the differential output signal. In another differential embodiment, only one input single-ended peak detector is provided since both input peak detectors are duplicates. In this latter embodiment, an single input peak detector is used for both positive polarities of the first and second peak signal approximations.

The compensation circuit is configured in any suitable manner to develop the compensation signal to follow the non-linear portion. In one embodiment, the compensation circuit includes a transconductance amplifier circuit and a square-root circuit. In another embodiment, the compensation circuit includes a differential pair circuit and a translinear loop square-root circuit. The differential pair circuit has a differential input receiving the second peak signal approximation and converts the second peak signal approximation into a first current using a second constant current. The translinear loop square-root circuit receives the first current, multiplies the first current by a constant third current to achieve a current multiple, and performs a square-root function of the current multiple to provide the compensation signal. In a more specific embodiment, the first peak detector includes a transistor coupled to a capacitor at a negative polarity node which develops the negative polarity signal, and the translinear loop square-root circuit output is coupled to the negative polarity node of the first peak detector. The constant second and third currents are selected to optimize compensation. In one embodiment, for example, the levels of the second and third currents are selected to generated a constant factor to equalize with the non-linear term of the generated peak signal.

A wide linear range peak detector according to an embodiment of the present invention includes a first input single-ended peak detector, first and second reference single-ended peak detectors, and a compensation circuit. The first input single-ended peak detector has an input receiving an input signal and an output. The first and second reference single-ended peak detectors each have an input coupled to a constant voltage and an output. The outputs of the first input single-ended peak detector and the second reference single-ended peak detector form a first differential peak voltage approximation. The compensation circuit has an input receiving the first differential peak voltage approximation and an output coupled to the output of the first reference single-ended peak detector. The outputs of the first input single-ended peak detector and the first reference single-ended peak detector form a compensated differential peak voltage approximation.

The compensation circuit may include a transconductance amplifier and a square-root circuit. Alternatively, the compensation circuit may include a differential pair circuit and a translinear loop square-root circuit. The input and reference peak detectors may each be implemented as a single-ended transistor-based peak detector, which includes a transistor, a bias circuit, a constant current sink and a capacitor.

A method of determining the peak voltage of an input signal for a wide linear range includes generating a first peak signal approximation of the input signal in which the first peak signal approximation includes a non-linear portion which is a function of the peak voltage of the input signal, generating a second peak signal approximation, converting the second peak signal approximation to a compensation signal, and adjusting the first peak signal approximation by the compensation signal to compensate for the non-linear portion.

The method may include generating a first differential approximation across a pair of capacitive output terminals, converting the second peak signal approximation to a non-linear compensation current, and applying the compensation current to one of the pair of capacitive output terminals. The method may include converting the second approximation to a first current based on a constant second current, multiplying the first current by a constant third current and providing a squared current, and taking the square-root of the squared current. The method may include applying the input signal to the input of a first transistor-based single-ended peak detector circuit having a first capacitive output terminal, and coupling a constant voltage to the input of a second transistor-based single-ended peak detector circuit having a second capacitor output terminal. The method may include converting the second peak signal approximation to a compensation current and applying the compensation current to the second capacitor output terminal.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A wide linear range peak detector, comprising:
   a first peak detector having an input receiving an input signal and an output providing a first peak signal approximation which approximates a peak level of said input signal, wherein said first peak signal approximation comprises a non-linear portion which is a function of said peak level of said input signal;
   a second peak detector having an input receiving said input signal and an output providing a second peak signal approximation; and
   a compensation circuit having an input receiving said second peak signal approximation and an output which is coupled to said first peak detector, wherein said compensation circuit uses said second peak signal approximation to provide a compensation signal which compensates said non-linear portion of said first peak signal approximation;
   wherein said first peak detector comprises a differential peak detector providing said first peak signal approximation with positive and negative polarity signals; and
   wherein said compensation circuit has an output which is coupled to a selected one of said positive and negative polarity signals of said first peak signal approximation.

2. The wide linear range peak detector of claim 1, wherein:
   said first peak detector comprises:
      a first single-ended input peak detector having an input receiving said input signal and an output providing said positive polarity signal of said first peak signal approximation; and
      a first reference peak detector having an input coupled to a constant level and an output providing said negative polarity signal of said first peak signal approximation; and
   wherein said second peak detector comprises:
      a second single-ended input peak detector having an input receiving said input signal and an output providing a positive polarity signal of said second peak signal approximation; and
      a second reference peak detector having an input coupled to said constant level and an output providing a negative polarity signal of said second peak signal approximation.

3. The wide linear range peak detector of claim 1, wherein:
   said first peak detector comprises:
      a first single-ended input peak detector having an input receiving said input signal and an output providing a positive polarity signal for both of said first and second peak signal approximations; and
      a first reference peak detector having an input coupled to a constant value and an output providing said negative polarity signal of said first peak signal approximation; and
   wherein said second peak detector comprises:
      said first single-ended input peak detector; and
      a second reference peak detector having an input coupled to said constant level and an output providing a negative polarity signal of said second peak signal approximation.

4. The wide linear range peak detector of claim 1, wherein said compensation circuit comprises:
   a transconductance amplifier circuit having an input receiving said second peak signal approximation and an output; and
   a square-root circuit having an input coupled to said output of said transconductance amplifier circuit and an output providing said compensation signal.

5. The wide linear range peak detector of claim 1, wherein said compensation circuit comprises:
   a differential pair circuit having a differential input receiving said second peak signal approximation and an output, wherein said differential pair circuit converts said second peak signal approximation into a first current using a second constant current; and
   a translinear loop square-root circuit having an input coupled to said output of said differential pair circuit and an output providing said compensation signal, wherein said translinear loop square-root circuit multiplies said first current by a constant third current to achieve a current multiple and which performs a square-root function of said current multiple to provide said compensation signal.

6. The wide linear range peak detector of claim 5, wherein:
said first peak detector comprises a transistor coupled to a capacitor at a negative polarity node which develops said negative polarity signal; and
wherein said output of said translinear loop square-root circuit is coupled to said negative polarity node of said first peak detector.

7. The wide linear range peak detector of claim 5, wherein said constant second and third currents are selected to optimize compensation.

8. A wide linear range peak detector, comprising:
a first input single-ended peak detector having an input and an output, said input receiving an input signal;
a first reference single-ended peak detector having an input and an output, said input coupled to a constant voltage;
a second reference single-ended peak detector having an input and an output, said input coupled to said constant voltage;
wherein said outputs of said first input single-ended peak detector and said second reference single-ended peak detector form a first differential peak voltage approximation;
a compensation circuit having an input receiving said first differential peak voltage approximation and an output coupled to said output of said first reference single-ended peak detector; and
wherein said outputs of said first input single-ended peak detector and said first reference single-ended peak detector form a compensated differential peak voltage approximation.

9. The wide linear range peak detector of claim 8, further comprising:
a second input single-ended peak detector having an input receiving said input signal and an output; and
wherein said outputs of said second input single-ended peak detector and said second reference single-ended peak detector form said first differential peak voltage approximation provided to said input of said compensation circuit.

10. The wide linear range peak detector of claim 8, wherein said compensation circuit comprises:
a transconductance amplifier having a differential input receiving said first differential peak voltage approximation and an output providing a first current that is based on a constant second current; and
a square-root circuit which multiplies said first current by a constant third current to provide a current multiple and which takes the square-root of said current multiple to provide a compensation signal at said output of said compensation circuit.

11. The wide linear range peak detector of claim 8, wherein said compensation circuit comprises:
a differential pair circuit having a differential input receiving said first differential peak voltage approximation and an output providing a first current that is based on said first differential peak voltage approximation and a constant second current; and
a translinear loop square-root circuit having an input receiving said first current which multiplies said first current by a constant third current to provide a current multiple and which takes the square-root of said current multiple to provide a compensation signal at said output of said compensation circuit.

12. The wide linear range peak detector of claim 8, wherein said first input single-ended peak detector and said first and second reference single-ended peak detectors each comprise:
a bipolar-junction transistor having a base electrode, an emitter electrode, and a collector electrode coupled to a first voltage supply;
a bias circuit coupled to said base electrode of said bipolar-junction transistor;
a constant current sink coupled between said emitter electrode of said bipolar-junction transistor and a second voltage supply; and
a first capacitor coupled between said emitter electrode of said bipolar-junction transistor and said second voltage supply.

13. The wide linear range peak detector of claim 12, wherein said first input single-ended peak detector and said first and second reference single-ended peak detectors each further comprise a second capacitor coupled to said base electrode of said bipolar-junction transistor.

14. The wide linear range peak detector of claim 12, wherein said bias circuit comprises a resistor coupled between a bias voltage and said base electrode of said transistor.

15. A method of determining the peak voltage of an input signal for a wide linear range, comprising:
generating a first peak signal approximation of the input signal as a first differential approximation across a pair of capacitive output terminals, wherein the first peak signal approximation comprises a non-linear portion which is a function of the peak voltage of the input signal;
generating a second peak signal approximation;
converting the second peak signal approximation to a non-linear compensation current based on the non-linear portion of the first peak signal approximation; and
adjusting the first peak signal approximation by the compensation current to compensate for the non-linear portion by applying the compensation current to one of the pair of capacitive output terminals.

16. The method of claim 15, wherein said converting the second peak signal approximation to a non-linear compensation current comprises:
converting the second peak signal approximation to a first current based on a constant second current;
multiplying the first current by a constant third current and providing a squared current; and
taking the square-root of the squared current.

17. A method of determining the peak voltage of an input signal for a wide linear range, comprising:
generating a first peak signal approximation of the input signal, wherein the first peak signal approximation comprises a non-linear portion which is a function of the peak voltage of the input signal;
generating a second peak signal approximation;
converting the second peak signal approximation to a compensation signal based on the non-linear portion of the first peak signal approximation; and
adjusting the first peak signal approximation by the compensation signal to compensate for the non-linear portion; and wherein said generating the first and second peak signal approximations each comprise:
 applying the input signal to the input of a first transistor-based single-ended peak detector circuit having a first capacitive output terminal; and
 coupling a constant voltage to the input of a second transistor-based single-ended peak detector circuit having a second capacitor output terminal.

18. The method of claim 17, wherein said converting and adjusting comprises:
 converting the second peak signal approximation to a compensation current; and
 applying the compensation current to the second capacitor output terminal.

* * * * *